United States Patent
Wu et al.

(10) Patent No.: US 10,742,027 B2
(45) Date of Patent: Aug. 11, 2020

(54) METHOD AND DEVICE FOR ONLINE LIMIT EARLY-WARNING TO SHUNT CAPACITOR BANK

(71) Applicants: Wuxi Electric Power Company of State Grid Jiangsu Electric Power Corporation, Wuxi, Jiangsu (CN); Xi'an Boyuu Electric Co., Ltd, Xi'an, Shaanxi (CN)

(72) Inventors: Jun Wu, Wuxi Jiangsu (CN); Juncheng Liu, Wuxi Jiangsu (CN); Jun Zhu, Wuxi Jiangsu (CN); Haiping Shen, Wuxi Jiangsu (CN); Yuan Feng, Wuxi Jiangsu (CN)

(73) Assignee: Wuxi Electric Power Company of State Grid Jiangsu Electric Power Corporation, Wuxi (CN)

( * ) Notice: Subject to any disclaimer, the term of this patent is extended or adjusted under 35 U.S.C. 154(b) by 282 days.

(21) Appl. No.: 15/879,449

(22) Filed: Jan. 25, 2018

(65) Prior Publication Data
US 2019/0036333 A1     Jan. 31, 2019

(30) Foreign Application Priority Data

Mar. 20, 2017    (CN) .......................... 2017 1 0167255

(51) Int. Cl.
     *G01R 27/16*      (2006.01)
     *H02J 3/01*      (2006.01)
     (Continued)

(52) U.S. Cl.
     CPC .............. *H02J 3/01* (2013.01); *G01R 19/165* (2013.01); *G01R 19/2506* (2013.01);
     (Continued)

(58) Field of Classification Search
     CPC ................ G01R 31/028; G01R 19/165; G01R 19/2513; G01R 19/2506; G01R 27/16;
     (Continued)

(56) References Cited

U.S. PATENT DOCUMENTS

| | | | | |
|---|---|---|---|---|
| 2012/0194202 A1* | 8/2012 | Xiao | .................... | H02H 7/1203 324/548 |
| 2014/0320056 A1* | 10/2014 | Royak | ..................... | H02M 1/32 318/504 |

* cited by examiner

*Primary Examiner* — Lee E Rodak
*Assistant Examiner* — Brent J Andrews
(74) *Attorney, Agent, or Firm* — Luoh J. Wu; Continent Patent Office LLP

(57) ABSTRACT

A method for online limit early-warning to a shunt capacitor bank, and the method comprises: performing harmonic monitoring to the shunt capacitor bank; obtaining a measured voltage and a measured current, based on raw data obtained by the harmonic monitoring; obtaining a first parameter representing a ratio of the measured voltage to a rated voltage and a second parameter representing a ratio of the measured current to a rated current, based on the measured voltage and the measured current; obtaining a relation between an impedance correlation quantity of the shunt capacitor bank and a background harmonic voltage ratio, based on the first parameter, the second parameter, and an obtained series reactance ratio of a detected capacitor circuit; and performing online limit early-warning to the shunt capacitor bank, based on the relation. The present invention also discloses a device for online limit early-warning to a shunt capacitor bank.

8 Claims, 4 Drawing Sheets

(51) Int. Cl.
*H02H 7/16* (2006.01)
*G01R 19/25* (2006.01)
*G01R 19/165* (2006.01)
*G01R 31/64* (2020.01)
*H02J 3/18* (2006.01)

(52) U.S. Cl.
CPC ......... *G01R 19/2513* (2013.01); *G01R 27/16* (2013.01); *G01R 31/64* (2020.01); *H02H 7/16* (2013.01); *H02J 3/1864* (2013.01)

(58) Field of Classification Search
CPC ...... G01R 31/64; G01R 27/2605; H02H 7/16; H02J 3/01; H02J 3/1864
See application file for complete search history.

METHOD AND DEVICE FOR ONLINE LIMIT EARLY-WARNING TO SHUNT CAPACITOR BANK

CROSS-REFERENCE TO RELATED APPLICATIONS

The present application claims priority from Chinese patent Application No. CN201710167255.0 filed on Mar. 20, 2017, the entire contents of which are incorporated herein by reference.

TECHNICAL FIELD

The present invention relates to a field of power electronic technology, and specifically to a method and a device for online limit early-warning to a shunt capacitor bank.

BACKGROUND OF THE INVENTION

The power grid reactive power compensation device including a shunt capacitor bank is widely used in the power system. The connected compensation device changes the harmonic impedance properties of the power grid, and may cause resonance phenomena in case that no measure or an inappropriate measure is taken, such that the compensation device and adjacent electric devices in the connected power grid may be seriously damaged or destroyed.

In the prior methods for analyzing the resonance damages caused by running capacitors, with the system impedance and the background harmonic voltage at the connection point(s) to the capacitor(s) known, an offline prediction is performed as whether a connection of the capacitor into the power grid under the background harmonic may cause a resonance phenomenon, and whether the running capacitor is beyond its limit range. Herein as shown in FIG. 1, the power source open circuit voltage $$E = E_1 + \sum_n E_n,$$

wherein $E_1$ is the fundamental voltage, $$\sum_n E_n$$

is the background harmonic; $Z_{sys}$ is the system impedance and $Z_{sys}=R_{sys}+jX_{sys}$; C is the capacitor to be connected in.

By the above analysis to the damages of the resonance phenomena, the following problems may be presented: with the harmonic changing from time to time, the prior offline early-warning manner cannot precisely predict whether a connection of the capacitor into the power grid may cause a resonance phenomenon; in addition, with only the influence of a single capacitor on the resonance phenomenon is under consideration, the result of the above prediction is not sufficiently complete. However, in the prior art, there is not any solution for online analyzing the damages by resonance phenomenon in consideration of connection of capacitors, in a form of capacitor bank, into the power grid.

SUMMARY OF THE INVENTION

In view of this, in an embodiment, the present invention provides a method and a device for online limit early-warning to a shunt capacitor bank, thus achieving online limit early-warning to a shunt capacitor bank in a power grid and avoiding resonance damage.

In order to achieve the above objective, the technical solution according to an embodiment of the present invention is set forth as follows.

In an embodiment, the present invention provides a method for online limit early-warning to a shunt capacitor bank, and the method comprises:

performing harmonic monitoring to the shunt capacitor bank;

obtaining a measured voltage and a measured current, based on raw data obtained by the harmonic monitoring;

obtaining a first parameter representing a ratio of the measured voltage to a rated voltage and a second parameter representing a ratio of the measured current to a rated current, based on the measured voltage and the measured current;

obtaining a relation between an impedance correlation quantity of the shunt capacitor bank and a background harmonic voltage ratio, based on the first parameter, the second parameter, and an obtained series reactance ratio of a detected capacitor circuit; and performing online limit early-warning to the shunt capacitor bank, based on the relation.

In the above solution, the step of obtaining a relation between an impedance correlation quantity of the shunt capacitor bank and a background harmonic voltage ratio, based on the first parameter, the second parameter, and an obtained series reactance ratio of a detected capacitor circuit comprises:

obtaining the relation between an impedance correlation quantity η of the shunt capacitor bank and a background harmonic voltage ratio a, based on a preset mathematic analysis model for the shunt capacitor bank:

$$a^4\eta^4\left(m\times\sum_{h=h1,h2...}\left(\frac{1}{h}\right)^2\right) + a^2\eta^2\left(\sum_{h=h1,h2...}\left(\frac{1}{h}\right)^2 + m\right) + \left(1-\left(\frac{1-k}{k_u k_i}1.35\right)^2\right) = 0;$$

wherein k is the series reactance ratio of the detected capacitor circuit, h is the harmonic order and h1, h2 . . . are the main harmonic orders to be considered, m is the harmonic spectrum number to be considered, $k_u$ is the first parameter and $k_i$ is the second parameter.

In the above solution, a relation between the impedance correlation quantity η of the shunt capacitor bank and an impedance $Z_{CL}$ of the shunt capacitor bank can be expressed as: $\eta_n = \gamma_n \delta_n$, wherein $$\gamma_n = \frac{Y_n}{Y_1}, \quad \delta_n = \frac{\frac{Y_{CL-i(n)}}{Y_{CL(n)}}}{\frac{Y_{CL-i(1)}}{Y_{CL(1)}}}, \quad Y_n = \left|\frac{1}{Z_{sys(n)} + Z_{CL(n)}}\right|,$$

$Y_{CL-i(n)}$ is the $n^{th}$ harmonic admittance of $i^{th}$ compensating branch of the shunt capacitor bank, wherein i and n are natural numbers and i≥1, n≥1;

$Y_{CL-i(l)}$ is the fundamental admittance of the $i^{th}$ compensating branch of the shunt capacitor bank;

$Y_{CL(n)}$ is the sum of the $n^{th}$ harmonic admittances of all the compensating branches of the shunt capacitor bank;

$Y_{CL(1)}$ is the sum of the fundamental admittances of all the compensating branches of the shunt capacitor bank.

In the above solution, the step of obtaining the relation between the impedance correlation quantity $\eta$ of the shunt capacitor bank and the background harmonic voltage ratio a, based on the preset mathematic analysis model for the shunt capacitor bank $$a^4\eta^4\left(m\times\sum_{h=h1,h2...}\left(\frac{1}{h}\right)^2\right)+a^2\eta^2\left(\sum_{h=h1,h2...}\left(\frac{1}{h}\right)^2+m\right)+$$

$$\left(1-\left(\frac{1-k}{k_uk_i}1.35\right)^2\right)=0$$

comprises:

determining a relation curve between the impedance correlation quantity $\eta$ and the background harmonic voltage ratio a, based on the $k_u$, the $k_i$, the obtained series reactance ratio k of the detected capacitor circuit, the harmonic order h, the harmonic spectrum number m to be considered, the main harmonic orders h1, h2 . . . to be considered, as well as the mathematic analysis model.

In the above solution, the step of performing limit early-warning to the shunt capacitor bank, based on the relation between the impedance correlation quantity $\eta$ and the background harmonic voltage ratio a comprises:

measuring the background harmonic voltage ratio $a_n$ and the impedance correlation quantity $\eta_n$ corresponding to the $n^{th}$ harmonic; and performing limit early-warning to the shunt capacitor bank, when in a coordinate system of the relation curve, the point determined by the background harmonic voltage ratio $a_n$ and the impedance correlation quantity $\eta_n$ is located above the relation curve.

In an embodiment, the present invention provides a device for online limit early-warning to a shunt capacitor bank, and the device comprises:

a monitoring unit for performing harmonic monitoring to the shunt capacitor bank;

a first obtaining unit for obtaining a measured voltage and a measured current, based on raw data obtained by the harmonic monitoring;

a second obtaining unit for obtaining a first parameter representing a ratio of the measured voltage to a rated voltage and a second parameter representing a ratio of the measured current to a rated current, based on the measured voltage and the measured current;

a third obtaining unit for obtaining a relation between an impedance correlation quantity of the shunt capacitor bank and a background harmonic voltage ratio, based on the first parameter, the second parameter, and an obtained series reactance ratio of a detected capacitor circuit; and a warning unit for performing online limit early-warning to the shunt capacitor bank, based on the relation.

In the above solution, the third obtaining unit is further used for:

obtaining the relation between an impedance correlation quantity $\eta$ of the shunt capacitor bank and a background harmonic voltage ratio a, based on a preset mathematic analysis model for the shunt capacitor bank:

$$a^4\eta^4\left(m\times\sum_{h=h1,h2...}\left(\frac{1}{h}\right)^2\right)+a^2\eta^2\left(\sum_{h=h1,h2...}\left(\frac{1}{h}\right)^2+m\right)+$$

-continued $$\left(1-\left(\frac{1-k}{k_uk_i}1.35\right)^2\right)=0;$$

wherein k is the series reactance ratio of the detected capacitor circuit, h is the harmonic order and h1, h2 . . . are the main harmonic orders to be considered, m is the harmonic spectrum number to be considered, $k_u$ is the first parameter and $k_i$ is the second parameter.

In the above solution, a relation between the impedance correlation quantity $\eta$ of the shunt capacitor bank and an impedance $Z_{CL}$ of the shunt capacitor bank can be expressed as: $\eta_n=\gamma_n\delta_n$, wherein $$\gamma_n=\frac{Y_n}{Y_1},\ \delta_n=\frac{\frac{Y_{CL-i(n)}}{Y_{CL(n)}}}{\frac{Y_{CL-i(1)}}{Y_{CL(1)}}},\ Y_n=\left|\frac{1}{Z_{sys(n)}+Z_{CL(n)}}\right|,$$

$Y_{CL-i(n)}$ is the $n^{th}$ harmonic admittance of the $i^{th}$ compensating branch of the shunt capacitor bank, wherein i and n are natural numbers and i≥1, n≥1;

$Y_{CL-i(1)}$ is the fundamental admittance of the $i^{th}$ compensating branch of the shunt capacitor bank;

$Y_{CL(n)}$ is the sum of the $n^{th}$ harmonic admittances of all the compensating branches of the shunt capacitor bank;

$Y_{CL(1)}$ is the sum of the fundamental admittances of all the compensating branches of the shunt capacitor bank.

In the above solution, the third obtaining unit is further used for:

determining a relation curve between the impedance correlation quantity $\eta$ and the background harmonic voltage ratio a, based on the $k_u$, the $k_i$, the obtained series reactance ratio k of the detected capacitor circuit, the harmonic order h, the harmonic spectrum number m to be considered, the main harmonic orders h1, h2 . . . to be considered, as well as the mathematic analysis model.

In the above solution, the warning unit is further used for:

measuring the background harmonic voltage ratio $a_n$ and the impedance correlation quantity $\eta_n$ corresponding to the $n^{th}$ harmonic; and performing limit early-warning to the shunt capacitor bank, when in a coordinate system of the relation curve, the point determined by the $a_n$ and the $\eta_n$ is located above the relation curve.

In the method and the device for online limit early-warning to a shunt capacitor bank according to the embodiments of the present invention, a relation between the impedance correlation quantity of the shunt capacitor bank and the background harmonic voltage ratio is obtained based on the raw data obtained by harmonic monitoring in combination with other known quantities, and the online limit early-warning is performed to the shunt capacitor bank based on the relation, thus achieving online warning to the shunt capacitor bank in the power grid and better avoiding harmonic damages compared to the prior art.

DESCRIPTION OF EXEMPLARY EMBODIMENTS

Hereinafter, to make the features and the technical contents of the present invention better understood, the present invention will be explained in detail with reference to the accompanying drawings. The accompanying drawings are provided only for reference and description, not for limiting the scope of the present invention.

Figure 3:
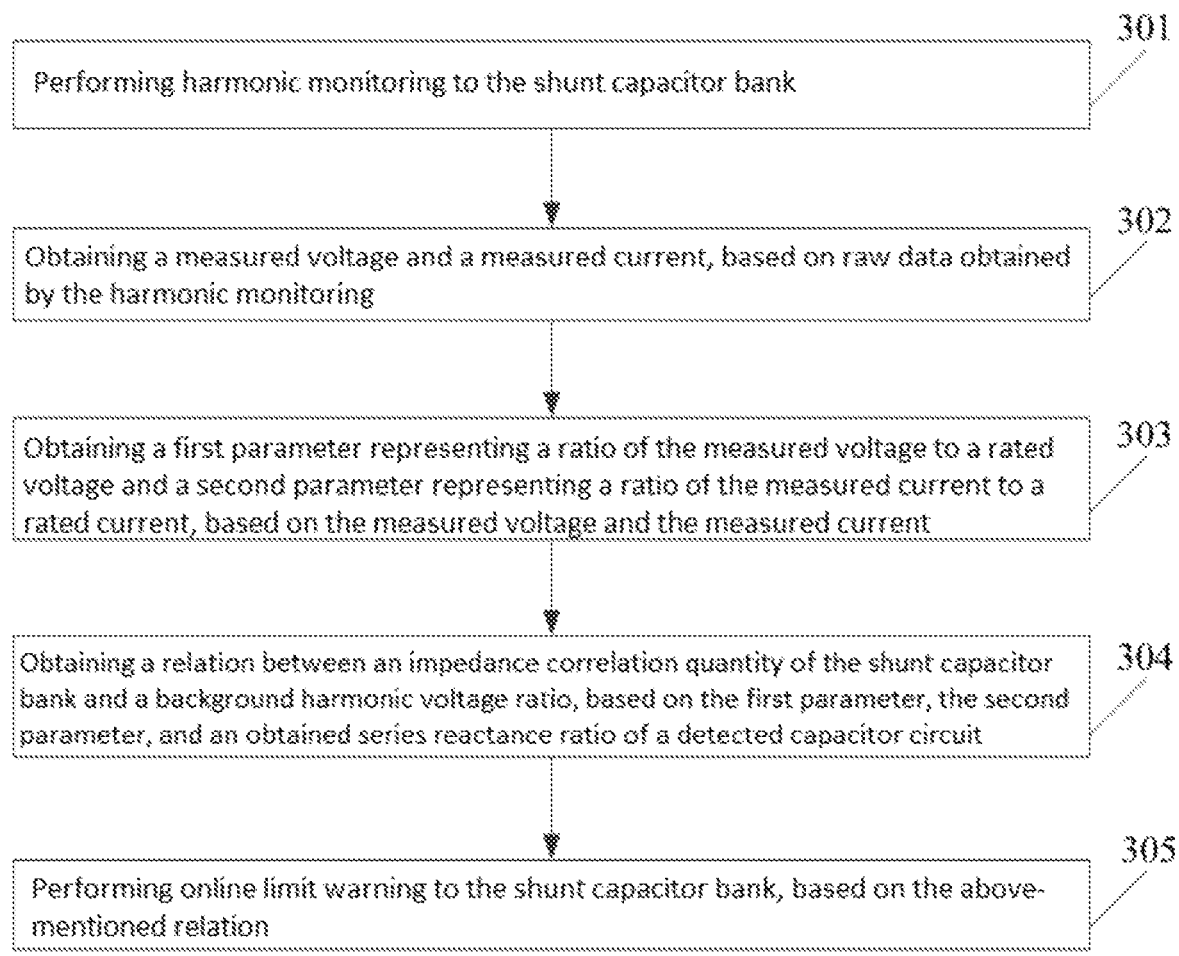
FIG. 3 is a flowchart of a method for online limit early-warning to a shunt capacitor bank according to an embodiment of the present invention.

FIG. 3 is a flowchart of a method for online limit early-warning to a shunt capacitor bank according to an embodiment of the present invention. As shown in FIG. 3, according to an embodiment of the present invention, a method for online limit early-warning to a shunt capacitor bank is provided, comprising:

Step 301: performing harmonic monitoring to the shunt capacitor bank;

Step 302: obtaining a measured voltage and a measured current, based on raw data obtained by the harmonic monitoring;

Step 303: obtaining a first parameter representing a ratio of the measured voltage to a rated voltage and a second parameter representing a ratio of the measured current to a rated current, based on the measured voltage and the measured current;

Step 304: obtaining a relation between an impedance correlation quantity of the shunt capacitor bank and a background harmonic voltage ratio, based on the first parameter, the second parameter, and an obtained series reactance ratio of a detected capacitor circuit;

Step 305: performing online limit early-warning to the shunt capacitor bank, based on the above relation.

In the above solution, a relation between the impedance correlation quantity η of the shunt capacitor bank and the background harmonic voltage ratio a is obtained based on the measured harmonic monitoring data in combination with other known series reactance ratio data, and the online limit early-warning is performed to the shunt capacitor bank based on the relation, thus enabling precise limit early-warning to the shunt capacitor bank even if the harmonic changes from time to time.

Figure 1:
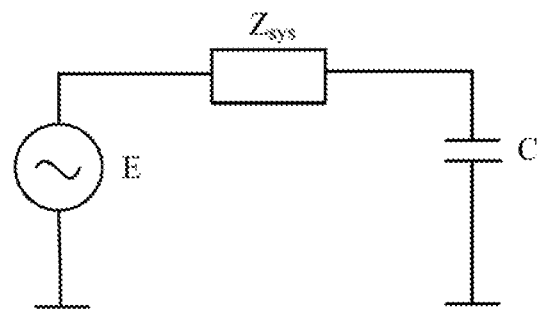
FIG. 1 is a structural diagram of a circuit having a capacitor connected in the power grid according to the prior art.
Figure 2:
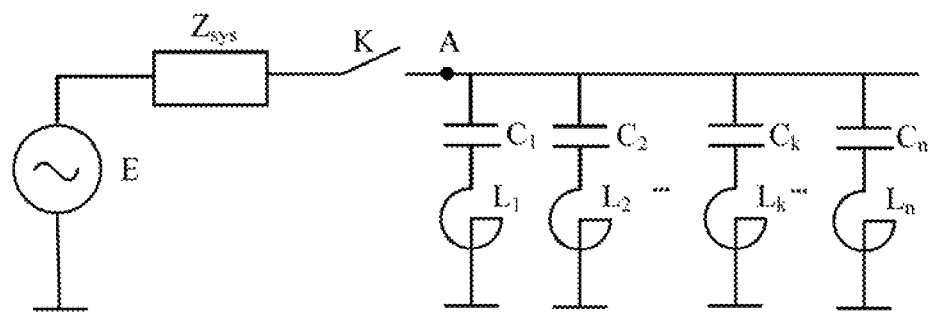
FIG. 2 is a structural diagram of a circuit having a capacitor connected in the power grid according to an embodiment of the present invention.

As shown in FIG. 2, before the switch K is closed, an open circuit equivalent voltage E can be obtained according to Thevenin's equivalent circuit, and the E is the background voltage, wherein $$E = E_1 + \sum_n E_n,$$

$E_n = a_n E_1$, and $E_1$ is the fundamental voltage.

In an embodiment of the present invention, n is the harmonic order, $E_n$ is the nth-harmonic voltage, $a_n$ is the nth background harmonic voltage ratio, and $\eta_n$ is the impedance correlation quantity corresponding to the nth harmonic.

In the relation between the impedance correlation quantity η of the shunt capacitor bank and the background harmonic voltage ratio a, different impedance correlation quantities η correspond to different background harmonic voltage ratios a, respectively, that is, $\eta_n$ corresponds to $a_n$.

In the step 304, the relation between η and a is obtained based on the preset mathematic analysis model for the shunt capacitor bank, and the mathematic analysis model is expressed as follows:

$$a^4 \eta^4 \left( m \times \sum_{h=h1,h2...} \left(\frac{1}{h}\right)^2 \right) + a^2 \eta^2 \left( \sum_{h=h1,h2...} \left(\frac{1}{h}\right)^2 + m \right) + \left( 1 - \left( \frac{1-k}{k_u k_i} 1.35 \right)^2 \right) = 0;$$

wherein k is the series reactance ratio of the detected capacitor circuit, h is the harmonic order and h1, h2 . . . are the main harmonic orders to be considered, m is the harmonic spectrum number to be considered, $k_u$ is the first parameter and $k_i$ is the second parameter.

By taking the parameters of the calculated background harmonic voltage ratio and k, $k_u$, $k_i$, m, h, h1, h2 . . . etc. into the above mathematic analysis model, a η-a relation curve can be obtained.

In an embodiment of the present invention, a relation between the impedance correlation quantity η of the shunt capacitor bank and an impedance $Z_{CL}$ of the shunt capacitor bank can be expressed as: $\eta_n = \delta_n \delta_n$, wherein $$\gamma_n = \frac{Y_n}{Y_1}, \quad \delta_n = \frac{\frac{Y_{CL-i(n)}}{Y_{CL(n)}}}{\frac{Y_{CL-i(1)}}{Y_{CL(1)}}}, \quad Y_n = \left| \frac{1}{Z_{sys(n)} + Z_{CL(n)}} \right|,$$

$Y_{CL-i(n)}$ is the $n^{th}$ harmonic admittance of the $i^{th}$ compensating branch of the shunt capacitor bank, wherein i and n are natural numbers and i≥1, n≥1;

$Y_{CL-i(1)}$ is the fundamental admittance of the $i^{th}$ compensating branch of the shunt capacitor bank;

$Y_{CL(n)}$ is the sum of the $n^{th}$ harmonic admittances of all the compensating branches of the shunt capacitor bank;

$Y_{CL(1)}$ is the sum of the fundamental admittances of all the compensating branches of the shunt capacitor bank;

$Z_{sys(n)}$ is the system impedance under the $n^{th}$ harmonic background; and $Z_{CL(n)}$ is the impedance of the shunt capacitor bank under the $n^{th}$ harmonic background.

In the above mathematic analysis model, the series reactance ratio of the detected capacitor circuit is under consideration. In practical application, the series reactance ratio will influence the $\delta_n$ and thus influence the impedance correlation quantity $\eta_n$.

Hereinafter, taking two groups of serial capacitor and reactor (C1, L1), (C2, L2) shown in FIG. 2 as examples, the influence of the series reactance ratio on the $\eta_n$ will be analyzed:

Assuming that the series reactance ratios of the two groups of serial capacitor and reactor are k1, k2, respectively, $$k_1 = \frac{Z_{L1}}{Z_{C1}}, \quad k_2 = \frac{Z_{L2}}{Z_{C2}};$$

and as known from the circuit analysis, the $n^{th}$ harmonic impedance of the branch formed by the capacitor C1 and the reactance L1 is $Z_{CL-1(n)} = Z_{C1} - nZ_{L1}$, and the $n^{th}$ harmonic impedance of the branch formed by the capacitor C2 and the reactance L2 is $Z_{CL-2(n)} = Z_{C2} - nZ_{L2}$.

Therefore, when $Z_{c1} = Z_{c2}$ and $k1 = k2$, $\delta_n = 1$.

When $Z_{c1} = Z_{c2}$ and $k1 \neq k2$, as known from the expression:

$$\delta_n = \frac{\frac{Y_{CL-i(n)}}{Y_{CL(n)}}}{\frac{Y_{CL-i(1)}}{Y_{CL(1)}}},$$

$$\delta_n = \frac{(1-nk2)(2-k1-k2)}{(2-nk1-nk2)(1-k2)}.$$

Figure 4:
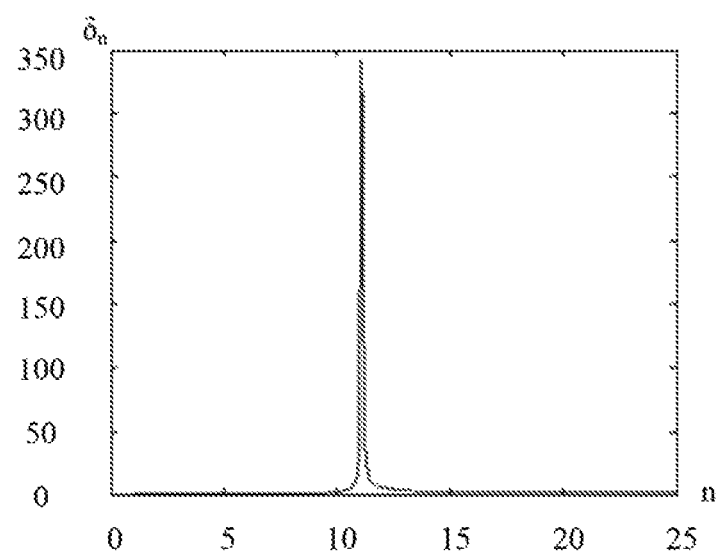
FIG. 4 is a diagram of a curve showing $\delta_n$~n relation according to an embodiment of the present invention.

When k1=6% and k2=12%, the $\delta_n$~n curve is presented as shown in FIG. 4. As can be seen, the influence of k on $\delta_n$ cannot be ignored. The embodiments of the present invention are applicable to online limit early-warning to a generally used shunt capacitor bank in series with reactor, and the series reactance ratio k is under consideration, facilitating precise limit early-warning to a shunt capacitor bank. After obtaining the relation curve of the impedance correlation quantity η and the background harmonic voltage ratio a, for performing limit early-warning to the shunt capacitor bank, first, it is necessary to calculate the background harmonic voltage ratio $a_n$ and the impedance correlation quantity $\eta_n$ corresponding to the $n^{th}$ harmonic; next, when in a coordinate system of the relation curve, the point determined by the $a_n$ and the $\eta_n$ is located above the relation curve, the limit early-warning to the shunt capacitor bank is performed.

The $a_n$ is calculated as follows: in the circuit shown in FIG. 2, after the switch K is closed, a test voltage $E_{CS}$ at A point of the bus can be measured; and with the test voltage $E_{CS}$ at A point, the background voltage E can be calculated based on a relation conversion equation between the measured each harmonic voltage and the background voltage, wherein the relation conversion equation is: $E_{CS}/E = |Z_{CL(n)}/(Z_{CL(n)} + Z_{sys(n)})|$, wherein $Z_{CL(n)}$ is the $n^{th}$ harmonic total impedance of the capacitor bank, $Z_{sys(n)}$ is the $n^{th}$ harmonic impedance of the system, and the $Z_{CL(n)}$ and the $Z_{sys(n)}$ can be obtained by circuit analysis.

After obtaining the E, based on the equation $$E = E_1 + \sum_n E_n,$$

$E_n = a_n E_1$, the value of $a_n$ can be obtained.

The impedance correlation quantity $\eta_n$ can also be obtained by calculation and analysis.

For limit early-warning, the measured $a_n$ may be taken into the above relation curve to see the magnitude relation of the obtained η value and the measured impedance correlation quantity $\eta_n$, that is, judging whether the point determined by the measured $a_n$ and $\eta_n$ is located above the relation curve, to judge whether the limit of the shunt capacitor bank is beyond the value range defined by the relation curve. If the limit is beyond the value range as defined, a filter device may be added or the running manner may be changed accordingly.

In the method for online limit early-warning to a shunt capacitor bank according to the embodiments of the present invention, a relation between the impedance correlation quantity of the shunt capacitor bank and the background harmonic voltage ratio is obtained based on the raw data obtained by harmonic monitoring in combination with other known quantities, and the limit early-warning is performed to the shunt capacitor bank based on the relation, thus achieving online early-warning to the shunt capacitor bank in the power grid and better avoiding resonance damages compared to the prior art.

Figure 5:
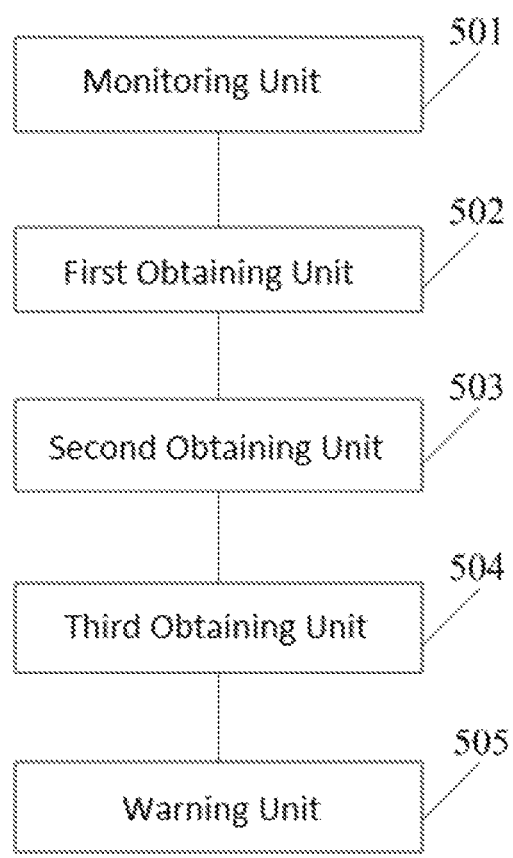
FIG. 5 is a structural diagram of a device for online limit early-warning to a shunt capacitor bank according to an embodiment of the present invention.

As shown in FIG. 5, according to the embodiments of the present invention, a device for online limit early-warning to a shunt capacitor bank is provided, comprising:

a monitoring unit 501 for performing harmonic monitoring to the shunt capacitor bank;

a first obtaining unit 502 for obtaining a measured voltage and a measured current, based on raw data obtained by the harmonic monitoring;

a second obtaining unit 503 for obtaining a first parameter representing a ratio of the measured voltage to a rated voltage and a second parameter representing a ratio of the measured current to a rated current, based on the measured voltage and the measured current;

a third obtaining unit 504 for obtaining a relation between an impedance correlation quantity of the shunt capacitor bank and a background harmonic voltage ratio, based on the first parameter, the second parameter, and an obtained series reactance ratio of a detected capacitor circuit; and a warning unit 505 for performing online limit early-warning to the shunt capacitor bank, based on the above relation.

Specifically, the third obtaining unit 504 is further used for: obtaining the relation between an impedance correlation quantity η of the shunt capacitor bank and a background harmonic voltage ratio a, based on a preset mathematic analysis model for the shunt capacitor bank, the mathematic analysis model is expressed as:

$$a^4\eta^4\left(m \times \sum_{h=h1,h2...}\left(\frac{1}{h}\right)^2\right) + a^2\eta^2\left(\sum_{h=h1,h2...}\left(\frac{1}{h}\right)^2 + m\right) + \left(1 - \left(\frac{1-k}{k_u k_i}1.35\right)^2\right) = 0;$$

wherein k is the series reactance ratio of the detected capacitor circuit, h is the harmonic order and h1, h2 . . . are the main harmonic orders to be considered, m is the harmonic spectrum number to be considered, $k_u$ is the first parameter and $k_i$ is the second parameter.

By taking the parameters of the calculated background harmonic voltage ratio and k, $k_u$, $k_i$, m, h, h1, h2 . . . etc. into the above mathematic analysis model, a η-a relation curve can be obtained.

In an embodiment of the present invention, a relation between the impedance correlation quantity η of the shunt capacitor bank and an impedance $Z_{CL}$ of the shunt capacitor bank can be expressed as: $\eta_n = \gamma_n \delta_n$, wherein $$\gamma_n = \frac{Y_n}{Y_1}, \quad \delta_n = \frac{\frac{Y_{CL-i(n)}}{Y_{CL(n)}}}{\frac{Y_{CL-i(1)}}{Y_{CL(1)}}}, \quad Y_n = \left| \frac{1}{Z_{sys(n)} + Z_{CL(n)}} \right|,$$

$Y_{CL-i(n)}$ is the $n^{th}$ harmonic admittance of the $i^{th}$ compensating branch of the shunt capacitor bank, wherein i and n are natural numbers and i≥1, n≥1;

$Y_{CL-i(1)}$ is the fundamental admittance of the $i^{th}$ compensating branch of the shunt capacitor bank;

$Y_{CL(n)}$ is the sum of the $n^{th}$ harmonic admittances of all the compensating branches of the shunt capacitor bank;

$Y_{CL(1)}$ is the sum of the fundamental admittances of all the compensating branches of the shunt capacitor bank;

$Z_{sys(n)}$ is the system impedance under the $n^{th}$ harmonic background; and $Z_{CL(n)}$ is the impedance of the shunt capacitor bank under the $n^{th}$ harmonic background.

For obtaining the relation between the impedance correlation quantity η of the shunt capacitor bank and the background harmonic voltage ratio a, the third obtaining unit is further used for: determining a relation curve between the impedance correlation quantity η and the background harmonic voltage ratio a, based on the $k_u$, the $k_i$, the obtained series reactance ratio k of the detected capacitor circuit, the harmonic order h, the harmonic spectrum number m to be considered, the main harmonic orders h1, h2 . . . to be considered, as well as the mathematic analysis model.

The embodiments of the present invention are applicable to online limit early-warning to a generally used capacitor series reactor bank, and the series reactance ratio k is under consideration, facilitating precise limit early-warning to a shunt capacitor bank.

After obtaining the relation curve of the impedance correlation quantity η and the background harmonic voltage ratio a, for performing limit early-warning to the shunt capacitor bank, first, the warning unit measures the background harmonic voltage ratio $a_n$ and the impedance correlation quantity $\eta_n$ corresponding to the $n^{th}$ harmonic; next, when in a coordinate system of the relation curve, the point determined by the $a_n$ and the $\eta_n$ is located above the relation curve, the limit early-warning to the shunt capacitor bank is performed.

The impedance correlation quantity $\eta_n$ can also be obtained by calculation and analysis.

For limit early-warning, the measured $a_n$ and $\eta_n$ may be taken into the relation curve to see the magnitude relation of the obtained η value and the measured impedance correlation quantity $\eta_n$, that is, judging whether the point determined by the measured $a_n$ and $\eta_n$ is located above the relation curve, to judge whether the limit of the shunt capacitor bank is beyond the value range defined by the relation curve. If the limit is beyond the value range as defined, processes, such as adding a filter device or changing the running manner, may be performed accordingly.

In the device for online limit early-warning to a shunt capacitor bank according to the embodiments of the present invention, a relation between the impedance correlation quantity of the shunt capacitor bank and the background harmonic voltage ratio is obtained based on the raw data obtained by harmonic monitoring in combination with other known quantities, and the limit early-warning is performed to the shunt capacitor bank based on the relation, thus achieving online warning to the shunt capacitor bank in the power grid and better avoiding harmonic damages compared to the prior art.

In the practical applications, each of the monitoring unit 501, the first obtaining unit 502, the second obtaining unit 503, the third obtaining unit 504 as well as the warning unit 505 can be implemented by a central processing unit (CPU), a micro processor unit (MPU), a digital signal processor (DSP), or a field programmable gate array (FPGA), etc. provided on the device for online limit early-warning to the shunt capacitor bank.

It should be understood by those skilled in the art that the embodiments of the present invention can be provided as methods, systems, or computer program products. Therefore, the present invention can employ a form of a hardware embodiment, a software embodiment or a software-hardware combined embodiment. Also, the present invention can employ a form of a computer program product implemented on one or more computer readable storage media (including but not limited to a magnetic disc memory and an optical memory) containing computer usable program codes.

The present invention is described with reference to the flowchart(s) and/or block diagram(s) of the methods, devices (systems), and computer program products of the embodiments of the present invention. It should be understood that computer program instructions can be used to implement each flow and/or block in the flowchart(s) and/or block diagram(s) as well as the combination(s) thereof. These computer program instructions can be provided to a processor of a general computer, a special computer, an embedded processor or other programmable data processing devices to produce a machine such that the instructions performed by the processor of the computers or other programmable data processing devices can produce a device to implement one or more flows in the flow chart and/or the functions specified in one or more blocks in the block diagram.

These computer program instructions can also be stored in a computer readable storage which can guide a computer or other programmable data processing devices to work in a specific manner, such that the instructions stored in the computer readable storage can produce a product including the instruction device which can implement one or more flows in the flow chart and/or the functions specified in one or more blocks in the block diagram.

These computer program instructions can also be loaded to computers or other programmable data processing devices such that a series of operation steps can be performed on the computers or other programmable devices to enable processing made by the computers, thus performing the instructions on the computers or other programmable devices to provide the steps achieving the one or more flows in the flow chart and/or the functions specified in the one or more blocks in the block diagram.

The above description is only for the preferred embodiments of the present invention, but is not used for limiting the protection scope of the present invention.

The invention claimed is:

1. A method for online limit early-warning to a shunt capacitor bank, wherein the method comprises:
performing harmonic monitoring to the shunt capacitor bank;
obtaining a measured voltage and a measured current, based on raw data obtained by the harmonic monitoring;

obtaining a first parameter representing a ratio of the measured voltage to a rated voltage and a second parameter representing a ratio of the measured current to a rated current determining a relation curve between an impedance correlation quantity η of the shunt capacitor bank and a background harmonic voltage ratio $a_n$ based on a preset mathematic analysis model for the shunt capacitor bank:

$$a^4\eta^4\left(m\times\sum_{h=h1,h2...}\left(\frac{1}{h}\right)^2\right) + a^2\eta^2\left(\sum_{h=h1,h2...}\left(\frac{1}{h}\right)^2 + m\right) + \left(1-\left(\frac{1-k}{k_u k_i}1.35\right)^2\right) = 0$$

wherein, k is series reactance ratio of the detected capacitor circuit, h is harmonic order and h1, h2 . . . are main harmonic orders to be considered, m is harmonic spectrum number to be considered, $k_u$ is the first parameter and kj is the second parameter; and measuring a background harmonic voltage ratio $\alpha_n$ and the impedance correlation quantity η corresponding to the $n^{th}$ harmonic; and determining the limit of the shunt capacitor bank is beyond the value range defined by the relation curve and performing an online limit early warning to the shunt capacitor bank, when in a coordinate system of the relation curve, a point determined by the background harmonic voltage ratio $\alpha_n$ and the impedance correlation quantity η is located above the relation curve.

2. The method according to claim 1, wherein the relation between the impedance correlation quantity η of the shunt capacitor bank is expressed as: $\eta_n = \gamma_n \delta_n$, wherein $$\gamma_n = \frac{Y_n}{Y_1}, \quad \delta_n = \frac{\frac{Y_{CL-i(n)}}{Y_{CL(n)}}}{\frac{Y_{CL-i(1)}}{Y_{CL(1)}}}, \quad Y_n = \left|\frac{1}{Z_{sys(n)} + Z_{CL(n)}}\right|,$$

$Y_{CL-i(n)}$ is the $n^{th}$ harmonic admittance of the $i^{th}$ compensating branch of the shunt capacitor bank, wherein i and n are natural numbers and i≥1, n≥1;

$Y_{CL-i(1)}$ is the fundamental admittance of the $i^{th}$ compensating branch of the shunt capacitor bank;

$Y_{CL(n)}$ is the sum of the $n^{th}$ harmonic admittances of all the compensating branches of the shunt capacitor bank;

$Y_{CL(1)}$ is the sum of the fundamental admittances of all the compensating branches of the shunt capacitor bank; and ZCL is an impedance of the shunt capacitor bank.

3. The method according to claim 1, wherein, measuring the background harmonic voltage ratio $a_n$ corresponding to the $n^{th}$ harmonic comprises:

measuring a test voltage $E_{CS}$;

calculating a background voltage E based on the test voltage $E_{CS}$ and the following equation:

$E_{CS}/E = |Z_{CL(n)}/(Z_{CL(n)} + Z_{sys(n)})|$ wherein, $Z_{CL(n)}$ is the $n^{th}$ harmonic total impedance of the capacitor bank, $Z_{sys(n)}$ is the $n^{th}$ harmonic impedance of the system; and obtaining the value of $a_n$ based on the equation $$E = E_1 + \sum_n E_n, \quad E_n = a_n E_1.$$

4. The method according to claim 1, wherein, performing an online limit early warning to the shunt capacitor bank comprises: adding a filter device to the shunt capacitor bank.

5. The method according to claim 1, wherein, performing an online limit early warning to the shunt capacitor bank comprises: changing the running manner of the shunt capacitor bank.

6. A device for online limit early-warning to a shunt capacitor bank, wherein the device comprises:

at least one processor and a memory; wherein the memory stores computer readable instructions, wherein the at least one processor executes the computer readable instructions to; perform harmonic monitoring to the shunt capacitor bank;

obtain a measured voltage and a measured current, based on raw data obtained by the harmonic monitoring;

obtain a first parameter representing a ratio of the measured voltage to a rated voltage and a second parameter representing a ratio of the measured current to a rated current determine a relation curve between an impedance correlation quantity η of the shunt capacitor bank and a background harmonic voltage ratio $\alpha_n$ based on a preset mathematic analysis model for the shunt capacitor bank:

$$a^4\eta^4\left(m\times\sum_{h=h1,h2...}\left(\frac{1}{h}\right)^2\right) + a^2\eta^2\left(\sum_{h=h1,h2...}\left(\frac{1}{h}\right)^2 + m\right) + \left(1-\left(\frac{1-k}{k_u k_i}1.35\right)^2\right) = 0$$

wherein, k is series reactance ratio of the detected capacitor circuit, h is harmonic order and h1, h2 . . . are main harmonic orders to be considered, m is harmonic spectrum number to be considered, $k_v$ is the first parameter and $k_t$ is the second parameter; and measure a background harmonic voltage ratio $a_n$ and the impedance correlation quantity η corresponding to the $n^{th}$ harmonic; and determining the limit of the shunt capacitor bank is beyond the value range defined by the relation curve and performing an online limit early warning to the shunt capacitor bank, when in a coordinate system of the relation curve, a point determined by the background harmonic voltage ratio $\alpha_n$ and the impedance correlation quantity η is located above the relation curve.

7. The device according to claim 6, wherein the relation between the impedance correlation quantity q of the shunt capacitor bank is expressed as: $\eta_n = \gamma_n \delta_n$, wherein $$\gamma_n = \frac{Y_n}{Y_1}, \quad \delta_n = \frac{\frac{Y_{CL-i(n)}}{Y_{CL(n)}}}{\frac{Y_{CL-i(1)}}{Y_{CL(1)}}}, \quad Y_n = \left|\frac{1}{Z_{sys(n)} + Z_{CL(n)}}\right|,$$

$Y_{CL-i(n)}$ is the $n^{th}$ harmonic admittance of the $i^{th}$ compensating branch of the shunt capacitor bank, wherein i and n are natural numbers and i≥1, n≥1;

$Y_{CL-i(I)}$ is the fundamental admittance of the $i^{th}$ compensating branch of the shunt capacitor bank;

$Y_{CL(n)}$ is the sum of the $n^{th}$ harmonic admittances of all the compensating branches of the shunt capacitor bank;

$Y_{CL(I)}$ is the sum of the fundamental admittances of all the compensating branches of the shunt capacitor bank; and $Z_{CL}$ is an impedance of the shunt capacitor bank.

8. The device according to claim 6, wherein, the memory further stores second group of computer readable instructions, wherein the at least one processor executes the second group of computer readable instructions to:

measure a test voltage $E_{CS}$;

calculate a background voltage E based on the test voltage $E_{CS}$ and the following equation:

$$E_{CS}/E = |Z_{CL(n)}/(Z_{CL(n)} + Z_{sys(n)})|$$

wherein, $Z_{CL(n)}$ is the $n^{th}$ harmonic total impedance of the capacitor bank, $Z_{sys(n)}$ is the $n^{th}$ harmonic impedance of the system; and obtain the value of $a_n$ based on the equation $$E = E_1 + \sum_n E_n, \; E_n = a_n E_1.$$

* * * * *